United States Patent [19]

Yoshikawa

[11] Patent Number: 5,272,678
[45] Date of Patent: Dec. 21, 1993

[54] SEMICONDUCTOR MEMORY DEVICE WITH COLUMN-WISE SIGNAL ACCESS

[75] Inventor: Takashi Yoshikawa, Tokyo, Japan

[73] Assignee: Oki Electric Industry Co., Ltd., Tokyo, Japan

[21] Appl. No.: 715,491

[22] Filed: Jun. 14, 1991

[30] Foreign Application Priority Data

Jun. 15, 1990 [JP] Japan .................. 2-155034

[51] Int. Cl.⁵ .............................................. G11C 8/00
[52] U.S. Cl. .......................... 365/230.06; 365/230.08; 365/239
[58] Field of Search ............... 365/230.06, 230.08, 365/230.09, 239

[56] References Cited

U.S. PATENT DOCUMENTS

| | | | |
|---|---|---|---|
| 4,667,330 | 5/1987 | Kumagai | 371/71 |
| 4,723,228 | 2/1988 | Shah et al. | |
| 4,839,868 | 6/1989 | Sato et al. | 365/230.06 |
| 4,896,294 | 1/1990 | Shimizu et al. | 365/230.06 |
| 4,982,372 | 1/1991 | Matsuo | 365/230.03 |
| 4,985,867 | 1/1991 | Ishii et al. | 365/211 |

Primary Examiner—William L. Sikes
Assistant Examiner—Terry D. Cunningham
Attorney, Agent, or Firm—Edward D. Manzo

[57] ABSTRACT

A semiconductor memory device according to the present invention has data reading lines provided corresponding to word lines, second switches disposed between memory cells and the data reading lines to deliver data onto the data reading lines in accordance with a column address signal, and a column address generating circuit for generating an address signal. With this arrangement, it is possible to read out data stored in the memory cells arranged in a column-wise direction at increased speed. Further it is possible to eliminate a shift circuit, a shift value control circuit, a register and an input control circuit which are needed in conventional semiconductor memory devices to read the data from memory cells arranged in a column-wise direction, thereby reducing the scale of the circuit arrangement.

26 Claims, 3 Drawing Sheets

SEMICONDUCTOR MEMORY DEVICE WITH COLUMN-WISE SIGNAL ACCESS

REFERENCE TO RELATED APPLICATIONS

This application claims the right of priority under 35 U.S.C. 119 of Japanese Patent Application Serial No. 02-155034, filed on Jun. 15, 1990, the entire disclosure of which is incorporated herein by reference.

BACKGROUND OF THE INVENTION

1. Field of the Invention

The present invention relates to a semiconductor memory device, and in particular to a semiconductor memory device which can be advantageously applied for multi-port random access memories (RAMs).

2. Description of the Related Art

In recent years, with the digitalization of various kinds of electronic equipments, semiconductor memory devices have been used as indispensable components among various kinds of technical fields. Accordingly, a high reliability, a large capacity and a high speed process are required for such semiconductor memory devices, and the researches and developments in this field have been prosperously made. For example, U.S. Pat. No. 4,667,330 discloses such a semiconductor memory device as a related art.

FIG. 2 is a block diagram illustrating an arrangement of a conventional semiconductor memory device.

This semiconductor memory device incorporates a memory array 10 having a plurality of pairs of word lines 11-1, 11-2 . . . 11-$m$, 12-1, 12-2 . . . 12-$m$ and a plurality of bit lines 13-1, 13-2 . . . 13-$n$, 14-1, 14-2 . . . 14-$n$. Memory cells 15-11 . . . 15-1$n$, 15-21 . . . 15-2$n$, 15-$m$1 to 15-$mn$ for storing therein predetermined data, N-channel MOS type transistors 16-11, 16-1$n$, 16-21 to 16-2$n$, 16-$m$1 to 16-$mn$ for writing data, and N-MOS 17-11 to 17-1$n$, 17-21 to 17-2$n$, 17-$m$1 to 17-$mn$ are provided at cross points between these word lines and these bit lines, respectively.

Further, a read address generating circuit 18 is connected to the word lines 11-1 to 11-$m$ to generate a read row address signal. A write address generating circuit 19 is connected to the word lines 12-1 to 12-$m$ to generate a write address signal. A write data circuit 20 is connected to the bit lines 13-1 to 13-$n$ to deliver data to be written.

A shift circuit 21 is connected to the bit lines 14-1 to 14-$n$. This circuit 21 shifts data delivered from the memory array 10 in accordance with a predetermined shift value 22$a$ to obtain shifted output data S1, S2 to Sn. A shift value control circuit 22 is connected to the shift circuit 21 to deliver the predetermined shift value 22$a$. A register 23 is connected to the shift circuit 21. This register 23 also receives only an effective one among shift output data S1, S2 to Sn in accordance with an input enabling signal 24$a$. Further, the register 23 is connected thereto with an input control circuit 24 to deliver the above-mentioned input enabling signal 25.

Next, explanation will be made of operation in case data stored in, for example, memory cells 15-12, 15-22 to 15-$m$2 arranged in a column-wise direction are read onto the register 23. It is assumed that the memory cells 15-12, 15-22 to 15-$m$2 store therein data D12, D22 to Dm2, respectively.

When the read address generating circuit 18 enables only an address signal on the word line 11-1, the N-MOS transistors 17-11, 17-12 to 17-1$n$ are turned on. As a result, data stored in the memory cells 15-11, 15-12 to 15-$n$ are delivered to the bit lines 14-1, 14-2 to 14-$n$, respectively, and are received by the shift circuit 21. The shift circuit 21 shifts the above-mentioned data leftward by one bit in accordance with a shift value 22$a$ delivered from the shift value control circuit 22, and then delivers the shift output data S1, S2 to Sn toward the register 23. However, only the shift output data S1 is input to the register 23 in accordance with an input enabling signal 24$a$ delivered from the input control circuit 24. At this time, the shift output data S1 received by the register 23 is the data D12 in the memory cell 15-12.

Then, only a row address signal on the word line 11-2 is enabled to deliver data stored in the memory cells 15-21, 15-22 to 15-2$n$ onto the bit lines 14-1, 14-$n$. The shift circuit 21 shifts the data by 0 bit in accordance with a shift value 22$a$ delivered from the shift value control circuit 22, and delivers the shift output data S1, S2 to Sn to the register 23. Only the shift data S2 is received by the register 23 in accordance with an input enabling signal 24$a$ delivered from the input control circuit 24. At this time, the shift output data S2 received by the register 23 is the data D22 in the memory cell 15-22. Accordingly, data D12, D22 are held on the register 23.

Thereafter, the similar operation is repeated until the data Dm2 in the memory cell 15-$m$2 is received by the register 23.

However, there has been such a problem that such a conventional semiconductor memory device requires the shift circuit 23, the shift value control circuit 22 and the register 23 and the input control circuit 24 to read data stored in memory cells in a column-wise direction. Accordingly, it is difficult to decrease the circuit scale.

Further, there has been another problem in that when data stored in the m memory cells arranged in a column direction are read out, the shift circuit 21, the shift value control circuit 22, the register 23 and the input control circuit 24 have to be operated by m cycles, and accordingly, the process speed becomes slow.

BRIEF SUMMARY OF THE INVENTION

The present invention is made to eliminate the above-mentioned disadvantages inherent to the related art. Accordingly, one object of the present invention is to provide a semiconductor memory device which can provide a miniaturized circuit scale and a higher process speed.

According to a first aspect of the present invention, a semiconductor memory device for storing digital information and for reading the information to transmit the same to an external circuit comprises: a plurality of memory cells connected respectively to a plurality of word lines for transmitting an address signal and a plurality of bit lines for transmitting data, and adapted to store therein predetermined data; first switch means connected respectively to the memory cells, and adapted to deliver data stored in said memory cells onto the bit lines in accordance with a row address signal; and second switch means connected respectively to the memory cells and adapted to deliver data stored in the memory cell onto the bit lines in accordance with a column address signal.

Further, according to a second aspect of the present invention, there is provided a semiconductor memory device for storing digital information and for reading the information and transmitting the same to an external equipment, comprising: memory cells connected respectively to a plurality of word lines for transmitting a row address signal and a plurality of bit lines for transmitting data, and adapted to store therein predetermined data; first switch means connected respectively to the memory cells, and adapted to deliver data stored in the memory cells onto said bit lines in accordance with the row address signal; data reading lines provided corresponding respectively to the word lines; a column reading address generating means for generating a column address signal and transmitting the same onto the data reading lines; and second switch means connected between the memory cells and the data reading lines and adapted to deliver data stored in the memory cell onto the data reading lines in accordance with the column address signal.

In view of the above-mentioned arrangement according to present invention, the plurality of the second switch means deliver data stored in memory cells arranged in a column-wise direction onto data reading lines in accordance with a column address signal generated from the column read address generating circuit. With this arrangement, the process of reading data stored in the memory cell arranged in the column-wise direction can be carried out at a high speed.

Further scope of applicability of the present invention will become apparent from the detailed description and specific examples while indicated preferred embodiments of the invention are given by way of illustration only since various changes and modifications within the spirit and scope of the invention will become apparent to those skilled in the art from this detailed description.

BRIEF DESCRIPTION OF SEVERAL VIEWS OF DRAWINGS

These and other features and advantages of the invention may be more completely understood from the following detailed description of the preferred embodiments of the invention with reference to the accompanying drawings in which.

DETAILED DESCRIPTION OF THE INVENTION

Figure 1:
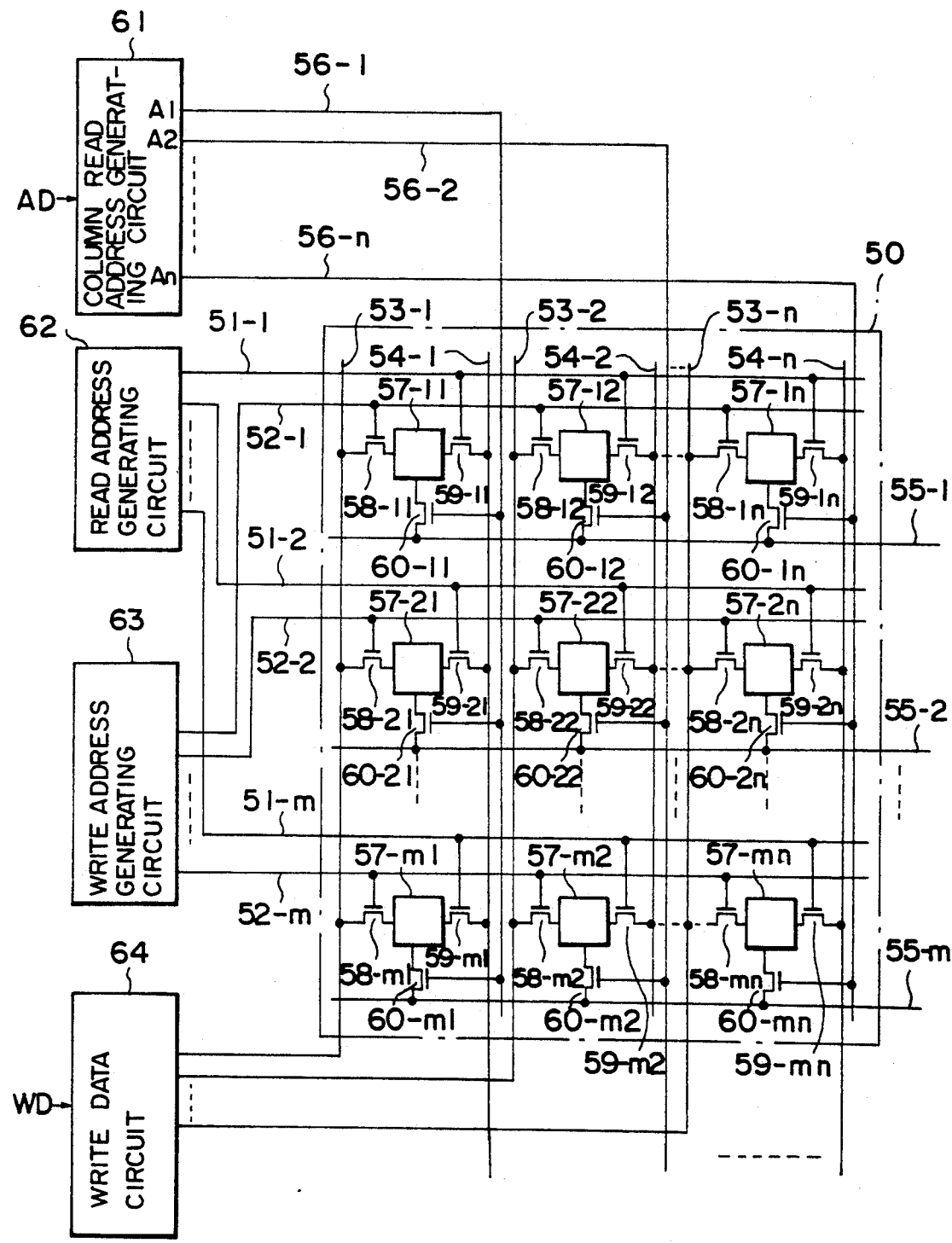
FIG. 1 is a block diagram illustrating an arrangement of an embodiment of a semiconductor memory device according to the present invention.
Figure 2:
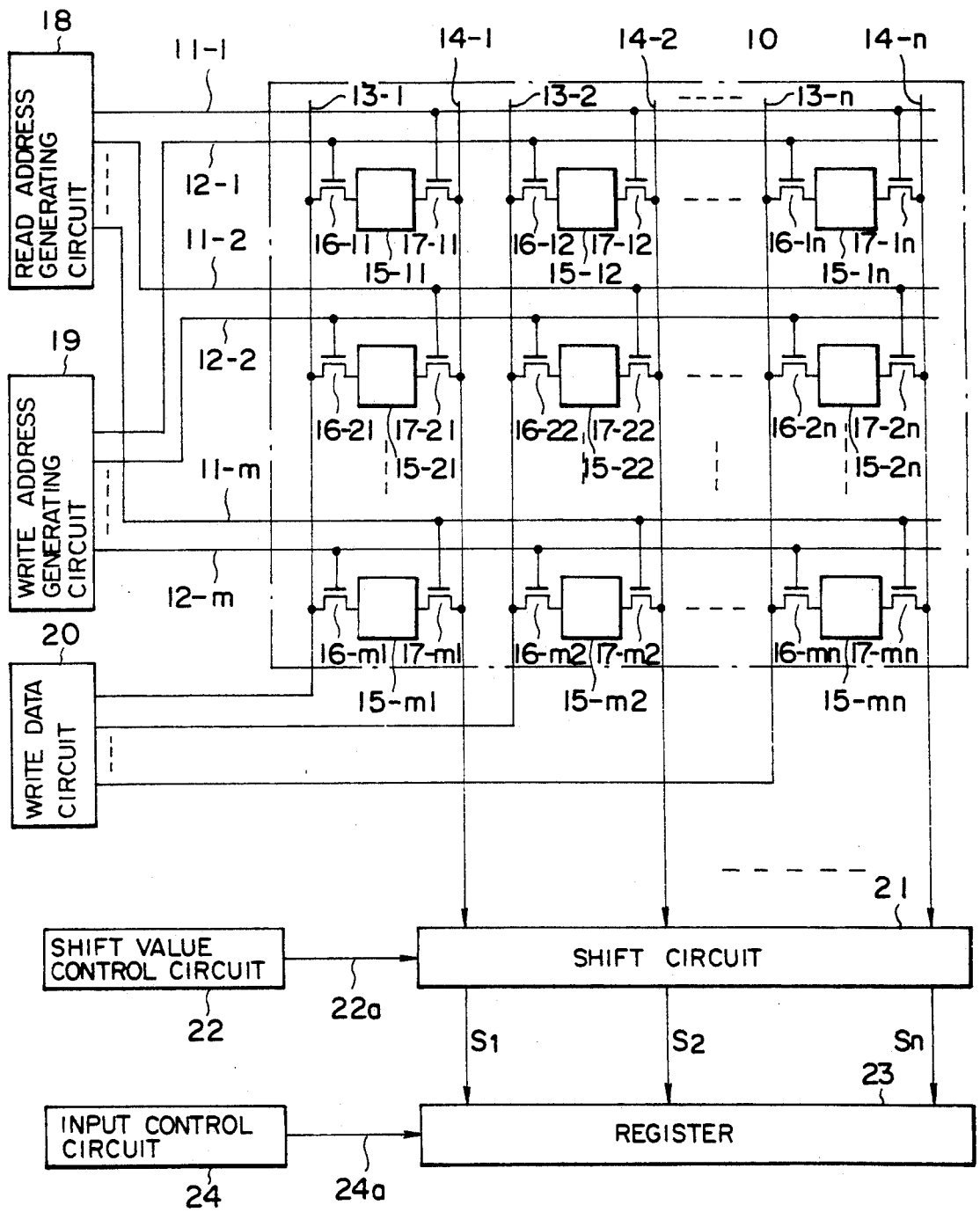
FIG. 2 is a block diagram illustrating an arrangement of a related art semiconductor memory device.

FIG. 1 is a block diagram which shows an arrangement of an example of a semiconductor memory device according to the present invention.

This semiconductor memory device incorporates a memory array 50 for storing information of m words × n bits. This memory array 50 has a plurality of word lines 51-1, 51-2 to 51-$m$, and a plurality of word lines 52-1, 52-2 to 52-$m$. Further, this semiconductor memory device includes bit lines 53-1, 53-2 to 53-$n$ for transmitting write data, bit lines 54-1, 54-2 to 54-$n$ for transmitting read data, and data reading lines 55-1, 55-2 to 55-$m$, and read address lines 56-1, 56-2 to 56-$n$ for transmitting column address signals A1, A2 to An.

Memory cells 57-11, 57-12 to 57-$mn$ for storing therein predetermined data are formed and arranged respectively at cross points between the pairs of word lines 51-1, 51-2 to 51-$m$, 52-1, 52-2 to 52-$m$ and the pairs of bit lines 53-1, 53-2 to 53-$n$, 54-1, 54-2 to 54-$n$ so as to be developed two-dimensionally.

Further, in the memory array 50, NMOS transistors 58-11 to 58-$mn$ have their drains connected to the bit lines 53-1 to 53-$n$, their gates connected to the word lines 52-1 to 52-$m$ and their sources connected to the input of the memory cells 57-11 to 57-$mn$, and NMOS transistors 59-11 to 59-$mn$ as first switch means have their sources connected to the bit lines 54-1 to 54-$n$, their gates connected to the word lines 51-1 to 51-$m$, and their drains connected to the output of the memory cells 57-11 to 57-$mn$. Moreover, the memory array 10 incorporates N-MOS transistors 60-11, 60-12 to 60-$mn$ as second switch means having their drains connected to the output of the memory cells 57-11 to 57-$mn$, their gates connected to the read address lines 56-1 to 56-$n$ and their sources connected to the data reading lines 55-1 to 55-$m$.

Transistors 58-11 to 58-$mn$ have such a function that write data on the bit lines 53-1 to 53-$n$ are written in the memory cells 57-11 to 57-$mn$, respectively, in accordance with write address signals on the word lines 52-1 to 52-$m$. Transistors 59-11 to 59-$mn$ have such a function that data stored in the memory cells 57-11 to 57-$mn$ are read onto the bit lines 54-1 to 54-$n$, respectively, in accordance with row read address signals on the word lines 51-1 to 51-$m$. Further, transistors 60-11, 60-12 to 60-$mn$ have such a function that data stored in the memory cells 57-11 to 57-$mn$ are delivered to the data reading lines 55-1 to 55-$m$, respectively, in accordance with column address signals A1, A2 to An on the read address lines 56-1 to 56-$n$.

A column read address generating circuit 61 composed of decoders or the like, is connected to the read address lines 56-1 to 56-$n$. This column address generating circuit 61 makes effective only one of the read address lines 56-1 to 56-$n$ in accordance with an address input AD represented by, for example, a binary numeral value and having a plurality of bits, and delivers column address signals A1 to An.

A read address generating circuit 62 composed of decoders or the like is connected to the word lines 51-1 to 51-$m$. This read address generating circuit 62 enables only one of the word lines 51-1 to 51-$m$, similar to the column read address generating circuit 61, in accordance with an external address input (not shown) so as to deliver a row address signal.

A write address generating circuit 63 composed of decoders is connected to the word lines 52-1 to 52-$m$ to deliver a write address signal to one of the word lines 52-1 to 52-$m$. A write data circuit 64 is connected to the bit lines 53-1 to 53-$n$ to deliver data to be written in the memory cells 57-11 to 57-$mn$ in accordance with a write signal WD. This write data circuit 64 is composed of tri-state buffers or the like.

Figure 3:
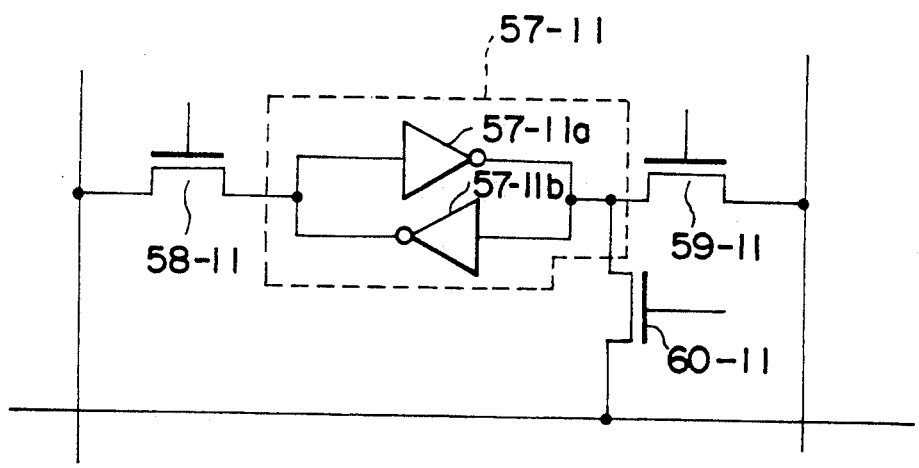
FIG. 3 is a circuit diagram illustrating an arrangement of memory cells, as an example, shown in FIG. 1.

FIG. 3 shows one example of the circuit arrangement of the memory cell 57-11 shown in FIG. 1.

Referring to FIG. 3, the memory cell 57-11 is composed of inverters 57-11$a$, 57-11$b$ which are connected invertedly and in parallel with each other. The memory cell 57-11 also are connected between the source of the N-MOS 58-11 and the drain of the N-MOS 59-11, respectively. Further, the drain of the N-MOS 59-11 is connected to the drain of the N-MOS 60-11.

Next, an explanation will be given for the operation of the above mentioned semiconductor memory device.

For example, it is assumed that the data D12 to Dm2 are data circuit written in the memory cells 57-12 to 57-m2, respectively. When the write signal WD is input to the write data circuit 64, the write data circuit 64 selects the bit line 53-2, for example. Further, of the word lines 52-1, 52-2 to 52-m, assume the word lines 52-1 is initially selected by an output of the write address generating circuit 63. Accordingly, transistor 58-12 at the cross point of the selected word line 52-1 and bit line 53-2 is turned on so that data is written in the memory cell 57-12.

Then, the write address generating circuit 63 selects the word lines 52-2 to 52-m, successively, so that the data D12, D22 to Dm2 are written in the memory cells 57-12, 57-22 to 57-m2, respectively.

Next, explanation will be made of an operation for reading the above-mentioned data D12, D22 to Dm2 from the memory cells 57-12, 57-22 to 57-m2.

At first, when the read address input AD is externally delivered to the column address generating circuit 61, the read address line 56-2 corresponding to the address input is selected among the read address lines 56-1 to 56-n. That is, transistors 60-12, 60-22 to 60-m2 are turned on by a column address signal A2 on the read address line 56-2. Accordingly, the data D12, D22 to Dm2 are delivered from the memory cells 57-12, 57-22 to 57-m2 onto the data reading lines 55-1 to 55-m, respectively. Thereafter, thus delivered data D12, D22 to Dm2 are transmitted to an external circuit or a buffer circuit (not shown) by way of a reading circuit.

Further, in the case of reading data stored in the memory cells 57-11, 57-12 to 57-1n arranged in the column-wise direction, the read address generating circuit 62 selects the word line 51-1. A row address signal on the selected word line 51-1 turns on transistors 59-11, 59-12 to 59-1n so that the data are delivered from the memory cells 57-11, 57-12 to 57-1n onto the bit lines 54-2 to 54-n, respectively.

Although the embodiment of the present invention, as shown in the drawings, has been described, the present invention should not be limited to only this embodiment but various changes and modifications may be made thereto. For example, as variant form of the embodiments, the following arrangement can be exemplified.

(a) Although the NMOS transistors are used as the second switches in the above-mentioned embodiment, they may be constituted with P-channel MOS type transistors or CMOS type transistors. In the case of constituting the second switches with the P channel MOS type transistors, the column address signals A1 to An would be active at a low logic (voltage) level "L". Similarly, the first switches may be constituted with P-channel MOS transistors.

(b) Although the memory cell is composed of the inverters 57-11a, 57-11b which are connected invertedly in parallel with each other, in the above-mentioned embodiment, the memory cell should not be limited to this arrangement. But any one of memory cells having different arrangements may be used therefor.

(c) The design conception of the present invention which concerns the provision of the column address switches can be applied for ROMs (read-only memory) or the like, in addition to static RAMs and dynamic RAMs.

Since the semiconductor memory device according to the above-mentioned embodiment can enhance remarkably the processing speed in comparison with a conventional one having the same actuating clock, it can be applied for a data processing unit which handles a large amount of information and operates at high speed. This embodiment can be advantageously applied for multi-port video RAM adapted to be used for image processing, image data or the like. Further, with this embodiment, since the complicated control used for a shift circuit and the like is not required in a reading process for memory cells arranged in column direction, it is possible to provide a semiconductor memory device having a high degree of reliability.

As mentioned above, according to the present invention, since the second switch means carries out switching operation in accordance with a column address signal generated from the column address generating circuit to deliver data stored in memory cells arranged in a column direction, the data stored in the memory cells can be read at high speed. Although the prior art has required a shift circuit, a shift value control circuit, a register and an input control circuit to read data stored in memory cells, the memory device according to the present invention can eliminate those circuits. Accordingly, it is possible to reduce the scale of the circuit arrangement.

What we claim is:

1. A semiconductor memory device comprising:
a memory cell array having a plurality of memory cells arranged in a matrix having a plurality of rows and columns, the memory cells storing predetermined data;
a plurality of first word lines, each of which is coupled to receive a respective first address signal selecting the memory cells arranged in the corresponding row;
a plurality of column address lines, each of which is coupled to receive a respective second address signal selecting the memory cells in the corresponding column;
a plurality of first bit lines for outputting the data stored in the memory cells;
a plurality of column data lines for outputting the data stored in the memory cells;
a first address generating circuit coupled to said first word lines for outputting the first address signal to one of said first word lines;
a second address generating circuit coupled to said column address lines for outputting the second address signal to one of said column address lines;
a plurality of first switches each having a first control electrode and first and second electrodes, each of the first electrodes coupled to a respective one of the memory cells, the first control electrodes of said first switches which are coupled to the memory cells in the same row being commonly coupled to one of said first word lines, the second electrodes of said first switches which are coupled to the memory cells in the same column being commonly coupled to one of said first bit lines; and
a plurality of second switches each having a second control electrode, third and fourth electrodes, each of the third electrodes coupled to a respective one of the memory cells, the second control electrodes of said second switches which are coupled to the memory cells in the same column being commonly coupled to one of said column address lines, the fourth electrodes of said second switches which are coupled to the memory cells in the same row being commonly coupled to one of said column data lines.

2. A semiconductor memory device as set forth in claim 1, wherein each of said first and second switches is a MOS type transistor.

3. A semiconductor memory device as set forth in claim 2, wherein each of said MOS type transistors is an N channel type MOS transistor.

4. A semiconductor memory device as set forth in claim 2, wherein each of said MOS type transistors is a P-channel type MOS transistor.

5. A semiconductor memory device as set forth in claim 1, wherein each of the memory cells is a memory cell for a dynamic random access memory.

6. A semiconductor memory device as set forth in claim 1, wherein each of the memory cells is a memory cell for a static random access memory.

7. A semiconductor memory device as set forth in claim 6, wherein each of the memory cells is composed of first and second inverters each of which is an input node and an output node, the input node of the first inverter being coupled to the output node of the second inverter and the input node of the second inverter being coupled to the output node of the first inverter.

8. A semiconductor memory device as set forth in claim 1, further comprising:
a plurality of second bit lines applied to write data;
a plurality of second word lines, each of which is coupled to receive a third address signal selecting the memory cells arranged in a corresponding row;
a third address generating circuit coupled to said second word lines for outputting the third address signal to one of said second word lines;
a write data circuit coupled to said second bit lines for outputting the write data to said second bit lines; and
a plurality of third switches each having a third control electrode and fifth and sixth electrodes, each of the fifth electrodes being coupled to a respective one of the memory cells, the third control electrodes of said third switches which are coupled to the memory cells in the same row being commonly coupled to one of said second word lines, the fifth electrodes of said third switches which are coupled to the memory cells in the same column being coupled to one of said second bit lines.

9. A semiconductor memory device as set forth in claim 8, wherein each of said third switches is a MOS type transistor.

10. A semiconductor memory device as set forth in claim 9, wherein each of said MOS type transistors is an N-channel type MOS transistor.

11. A semiconductor memory device as set forth in claim 9, wherein each of said MOS type transistors is a P-channel type MOS transistor.

12. A semiconductor memory device as set forth in claim 8, wherein each of the memory cells is a memory cell for a dynamic random access memory.

13. A semiconductor memory device as set forth in claim 8, wherein each of the memory cells is a memory cell for a static type random access memory.

14. A semiconductor memory device as set forth in claim 13, wherein each of the memory cells is composed of first and second inverters each of which has an input node and an output node, the input node of the first inverter being coupled to the output node of the second inverter, and the input node of the second inverter being coupled to the output node of the first inverter.

15. A semiconductor memory device comprising:
a memory cell array having a plurality of memory cells arranged in a matrix extending in first and second directions, the memory cells storing predetermined data;
a plurality of first selection lines each of which is coupled to receive a first selection signal selecting the memory cells arranged in the first direction;
a plurality of second selection lines each of which is coupled to receive a second selection signal selecting the memory cells in the second direction;
a plurality of first data lines for outputting the data stored in the memory cells;
a plurality of second data lines for outputting the data stored in the memory cells;
a first selection signal generating circuit coupled to said first selection lines for outputting the first selection signal to one of said first selection lines;
a second selection signal generating circuit coupled to said second selection lines for outputting the second selection signal to one of said second selection lines;
a plurality of first switches each having a first control electrode and first and second electrodes, each of the first electrodes coupled to a respective one of the memory cells, the first control electrodes of said first switches which are coupled to the memory cells in the first direction being commonly coupled to one of said first selection lines, the second electrodes of said first switches which are coupled to the memory cells in the second direction being commonly coupled to one of said first data lines; and
a plurality of second switches having a second control electrode and third and fourth electrodes, each of the third electrodes coupled to a respective one of the memory cells, the second control electrodes of said second switches which are coupled to the memory cells in the second direction being commonly coupled to one of said second selection lines, the fourth electrodes of said second switches which are coupled to the memory cells in the first direction being commonly coupled to one of said second data lines.

16. A semiconductor memory device as set forth in claim 15, wherein each of said first and second switches is a MOS type transistor.

17. A semiconductor memory device as set forth in claim 16, wherein each of said MOS type transistors is an N-channel type MOS transistor.

18. A semiconductor memory device as set forth in claim 16, wherein each of said MOS type transistors is a P-channel type MOS transistor.

19. A semiconductor memory device as set forth in claim 15, wherein each of the memory cells is a memory cell for a dynamic random access memory.

20. A semiconductor memory device as set forth in claim 15, wherein each of the memory cells is a memory cell for a static random access memory.

21. A semiconductor memory device as set forth in claim 15, further comprising:
a plurality of third data lines coupled to write data;
a plurality of third selection lines each of which is coupled to receive a third selection signal selecting the memory cells arranged in the first direction;
a third selection generating circuit coupled to said third selection lines for outputting the third selection signal to one of said third selection lines;

a write data circuit coupled to said third data lines for outputting the write data to said third data lines; and a plurality of third switches each having a third control electrode and fifth and sixth electrodes, each of the fifth electrodes being coupled to a respective one of the memory cells, the third control electrodes of said third switches which are coupled to the memory cells in the first direction being commonly coupled to one of said third selection lines, the fifth electrodes of said third switches which are coupled to the memory cells int eh second direction being coupled to one of said third data lines.

22. A semiconductor memory device as set forth in claim 21, wherein each of said first and second switches is a MOS type transistor.

23. A semiconductor memory device as set forth in claim 22, wherein each of said MOS type transistors is an N-channel type MOS transistor.

24. A semiconductor memory device as set forth in claim 22, wherein each of said MOS type transistors is a P-channel type MOS transistor.

25. A semiconductor memory device as set forth in claim 21, wherein each of the memory ells is a memory cell for a dynamic random access memory.

26. A semiconductor memory device as set forth in claim 21, wherein each of the memory cells is a memory cell for a static random access memory.

* * * * *